United States Patent
Sutardja et al.

(10) Patent No.: US 9,214,230 B2
(45) Date of Patent: *Dec. 15, 2015

(54) RESISTIVE RANDOM ACCESS MEMORY CELL STRUCTURE WITH REDUCED PROGRAMMING VOLTAGE

(71) Applicant: Marvell World Trade LTD., St. Michael (BB)

(72) Inventors: Pantas Sutardja, Los Gatos, CA (US); Albert Wu, Palo Alto, CA (US); Winston Lee, Palo Alto, CA (US); Peter Lee, Pleasanton, CA (US); Runzi Chang, San Jose, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/594,940

(22) Filed: Jan. 12, 2015

(65) Prior Publication Data

US 2015/0124520 A1 May 7, 2015

Related U.S. Application Data

(63) Continuation of application No. 14/050,720, filed on Oct. 10, 2013, now Pat. No. 8,934,285.

(60) Provisional application No. 61/713,894, filed on Oct. 15, 2012.

(51) Int. Cl.
*G11C 13/00* (2006.01)
*H01L 45/00* (2006.01)
*H01L 27/24* (2006.01)

(52) U.S. Cl.
CPC ........ *G11C 13/0069* (2013.01); *G11C 13/0007* (2013.01); *H01L 27/2436* (2013.01); *H01L 45/08* (2013.01); *H01L 45/1233* (2013.01); *H01L 45/1273* (2013.01); *H01L 45/146* (2013.01); *H01L 45/16* (2013.01); *G11C 13/0002* (2013.01); *G11C 2213/79* (2013.01)

(58) Field of Classification Search
CPC .......... G11C 13/0002; G11C 13/0007; G11C 13/0069; G11C 2213/79; H01L 45/08; H01L 45/16; H01L 45/146; H01L 45/1233; H01L 45/1273; H01L 27/2436
USPC ......................................... 365/148, 158, 163
See application file for complete search history.

(56) References Cited

U.S. PATENT DOCUMENTS

| | | | | |
|---|---|---|---|---|
| 5,687,112 A * | 11/1997 | Ovshinsky | ............. | G11C 11/56 257/3 |
| 7,791,057 B2 * | 9/2010 | Lung | .................. | G11C 11/5678 257/2 |
| 8,063,394 B2 * | 11/2011 | Andres | .................. | B82Y 10/00 257/2 |
| 8,624,218 B2 | 1/2014 | Chen | | |
| 8,934,285 B2 * | 1/2015 | Sutardja et al. | ................ | 365/148 |

* cited by examiner

Primary Examiner — Tan T Nguyen

(57) ABSTRACT

A cell of a resistive random access memory including (i) a resistive element and (ii) a switch. The resistive element includes (i) a first electrode, and (ii) a second electrode. The switch includes (i) a first terminal connected to a first contact, and (i) a second terminal connected to a second contact. The second contact is connected to the second electrode of the resistive element via a third contact. The third contact has a shape including a first surface and a second surface that is opposite to the first surface. The shape of the third contact tapers inward from the first surface towards the second surface.

20 Claims, 9 Drawing Sheets

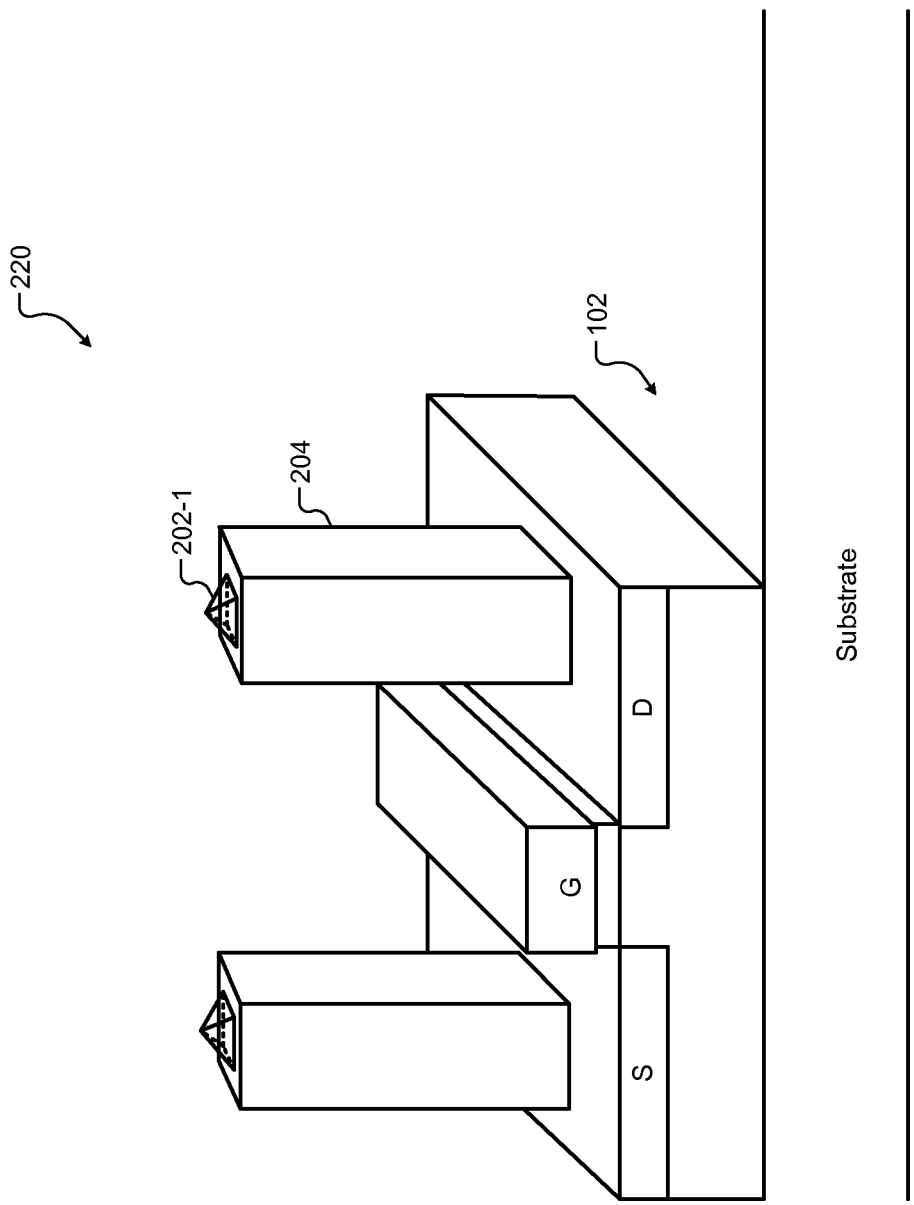

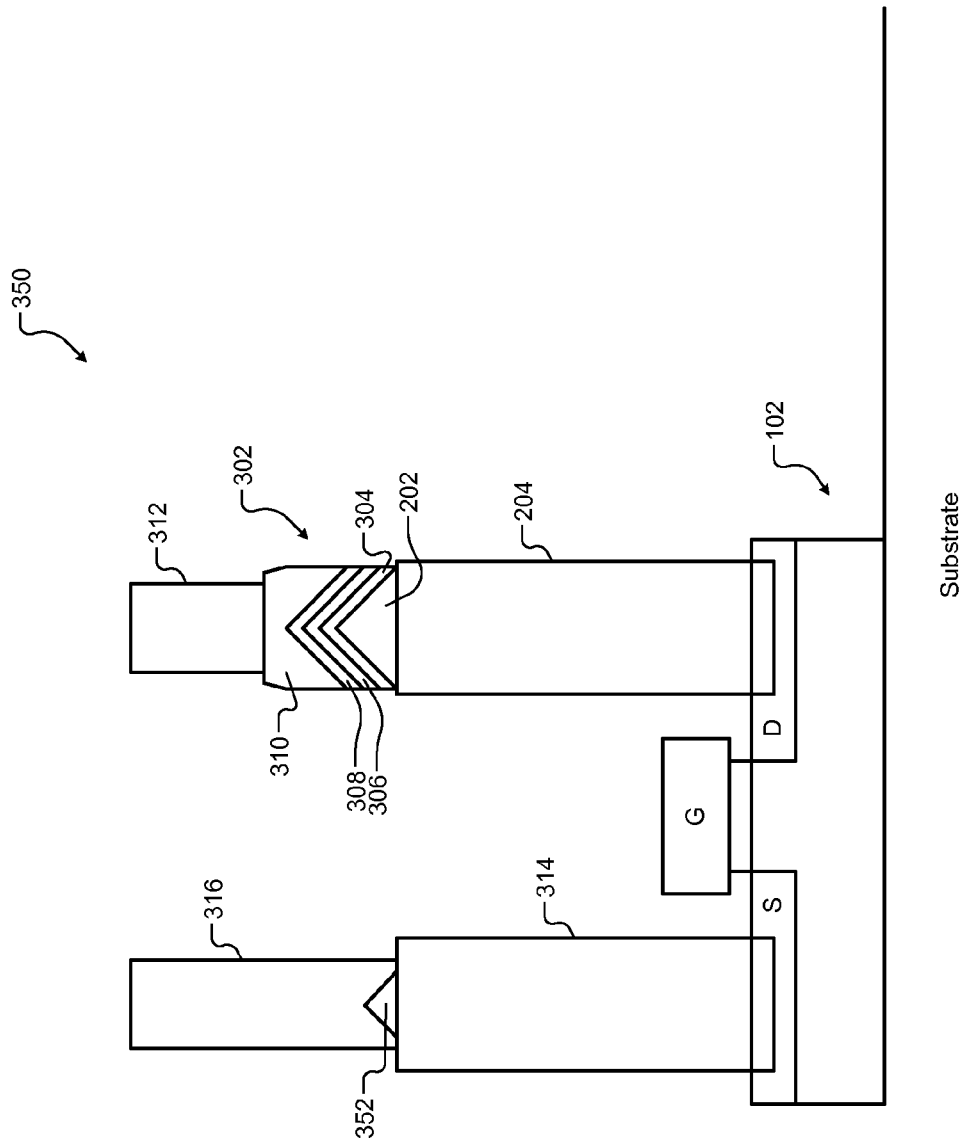

RESISTIVE RANDOM ACCESS MEMORY CELL STRUCTURE WITH REDUCED PROGRAMMING VOLTAGE

CROSS-REFERENCE TO RELATED APPLICATIONS

This application is a continuation of U.S. application Ser. No. 14/050,720 (now U.S. Pat. No. 8,934,285), filed Oct. 10, 2013, which claims the benefit of U.S. Provisional Application No. 61/713,894, filed on Oct. 15, 2012. The entire disclosures of the applications referenced above are incorporated herein by reference.

FIELD

The present disclosure relates generally to resistive random access memory (RRAM) cells and more particularly to techniques for forming a contact in a RRAM cell to reduce a voltage required to program the RRAM cell.

BACKGROUND

A resistive random access memory (RRAM) array includes RRAM cells arranged at intersections of word lines and bit lines. A RRAM cell includes an insulating material (e.g., a dielectric) as a resistive element. The resistance of the insulating material increases when current is passed through the insulating material in one direction, and decreases when current is passed through the insulating material in an opposite direction. Accordingly, a RRAM cell can be programmed to (i) a high resistance state by passing current through the RRAM cell in one direction, and (ii) a low resistance state by passing current through the RRAM cell in an opposite direction. The high resistance state can be used to denote logic high (binary 1), and the low resistance state can be used to denote logic low (binary 0), or vice versa.

RRAM cells that are programmed to high and low resistance states using currents of opposite polarities are called bipolar RRAM cells. Alternatively, RRAM cells can be programmed to high and low resistance states by passing currents of two different magnitudes in the same direction through the insulating material of the RRAM cells. RRAM cells that are programmed to high and low resistance states using currents of two different magnitudes in the same direction are called unipolar RRAM cells.

Each RRAM cell includes an access device such as a diode or a transistor. The access device is connected in series with the resistive element. Using the access device, the RRAM cells in the RRAM array can be selected and deselected during read and write operations.

SUMMARY

A cell of a resistive random access memory comprises a resistive element and an access device. The resistive element includes (i) a first electrode and (ii) a second electrode. The access device is configured to select and deselect the cell. The access device includes (i) a first terminal connected to a first contact and (i) a second terminal connected to a second contact. The second contact is connected to the second electrode of the resistive element via a third contact. The third contact includes (i) a first surface in contact with the second contact and (ii) a second surface in contact with the second electrode. The first surface defines a first surface area, and the second surface defines a second surface area. The first surface area is greater than the second surface area.

In another feature, the third contact has a shape of a pyramid or a cone.

In another feature, the cell further comprises an interface metal layer between the second contact and the first surface of the third contact.

In another feature, the third contact is partially etched to reduce a volume of the third contact.

In other features, the resistive element comprises a first layer of transitional metal oxide arranged adjacent to the second electrode, and a second layer of a reactive metal arranged adjacent to (i) the first layer of transitional metal oxide and (i) the first electrode.

In another feature, the first layer of transitional metal oxide is thinner near a center of the first layer relative to a remainder of the first layer.

In other features, the first electrode of the resistive element is connected to a fourth contact, and the first contact connected to the first terminal of the access device is connected to a bit line via fifth contact.

In other features, a sixth contact is arranged between (i) the first contact connected to the first terminal of the access device and (ii) the fifth contact, and the sixth contact has a structure of the third contact.

In another feature, the resistive element is configured to have (i) a first resistance in response to applying a first voltage across the first electrode and the second electrode and (ii) a second resistance in response to applying a second voltage across the first electrode and the second electrode.

In another feature, the access device further includes a control terminal connected to a word line.

In still other features, a method for connecting elements of a cell of a resistive random access memory, where the elements of the cell include (i) an access device and (ii) a resistive element, the access device includes (i) a first terminal and (ii) a second terminal, the resistive element includes (i) a first electrode and (ii) a second electrode, and the access device is used to select and deselect the cell. The method comprises connecting (i) the first terminal and (ii) the second terminal of the access device respectively to (i) a first contact and (ii) a second contact and connecting the second contact of the access device to the second electrode of the resistive element via a third contact. The third contact includes (i) a first surface in contact with the second contact and (ii) a second surface in contact with the second electrode. The first surface defines a first surface area, and the second surface defines a second surface area. The first surface area is greater than the second surface area.

In another feature, the third contact has a shape of a pyramid or a cone.

In another feature, the method further comprises arranging an interface metal layer between the second contact and the first surface of the third contact.

In another feature, the method further comprises partially etching the third contact to reduce a volume of the third contact.

In other features, the method further comprises forming the resistive element by arranging a first layer of transitional metal oxide adjacent to the second electrode, and by arranging a second layer of a reactive metal adjacent to (i) the first layer of transitional metal oxide and (i) the first electrode.

In another feature, the first layer of transitional metal oxide is thinner near a center of the first layer relative to a remainder of the first layer.

In other features, the method further comprises connecting the first electrode of the resistive element to a fourth contact, and connecting the first contacted to the first terminal of the access device to a bit line via fifth contact.

In another feature, the method further comprises arranging a sixth contact between (i) the first contact connected to the first terminal of the access device and (ii) the fifth contact, where the sixth contact has a structure of the third contact.

In other features, the method further comprises applying a first voltage across the first electrode and the second electrode to program the cell to a first resistance state, and applying a second voltage across the first electrode and the second electrode to program the cell to a second resistance state.

In other features, the method further comprises connecting a control terminal of the access device to a word line, and selecting and deselecting the cell using the word line.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 5 shows an example of a sharp contact that is etched back.

FIG. 7 shows an example of a RRAM cell including all the features of the RRAM cell shown in FIG. 6A, and additionally including a sharp contact grown on the surface of the source contact of the access device.

In the drawings, reference numbers may be reused to identify similar and/or identical elements.

DESCRIPTION

Figure 1A:
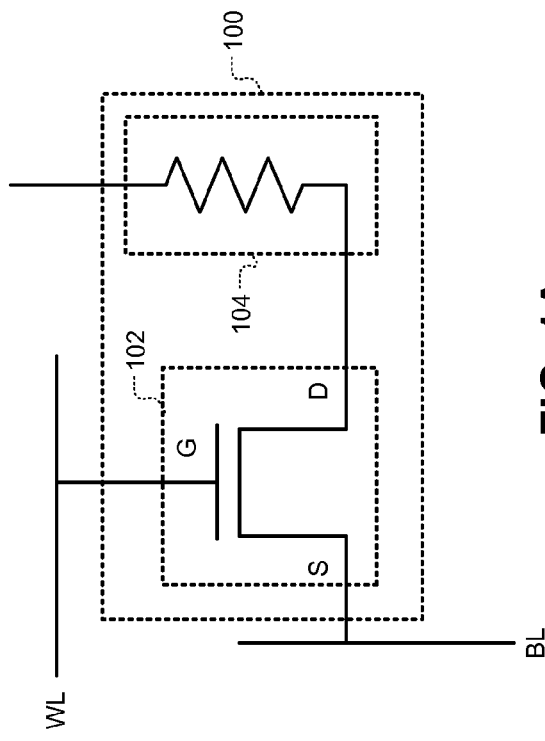
FIG. 1A shows a schematic of an example of a resistive random access memory (RRAM) cell.

FIG. 1A shows an example of a resistive random access memory (RRAM) cell 100. The RRAM cell 100 includes an access device 102 and a resistive element 104. In the example shown, the access device 102 includes a transistor. Alternatively, diodes or other suitable switching elements can be used as the access device 102.

Figure 1B:
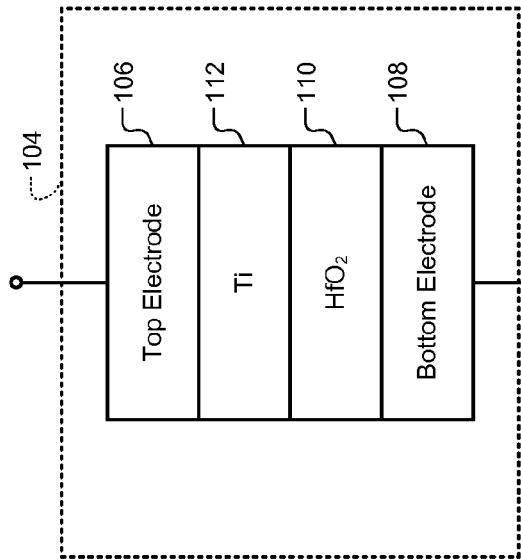
FIG. 1B shows a schematic of a resistive element of the RRAM cell shown in FIG. 1A.

FIG. 1B shows the resistive element 104. The resistive element 104 includes a top electrode 106, a bottom electrode 108, a dielectric layer 110, and a reactive metal layer 112. For example, the dielectric layer 110 includes a layer of a transitional metal oxide (e.g., $HfO_2$). The dielectric layer 110 acts as a donor of oxygen ions. For example, the reactive metal layer 112 includes a layer of titanium (Ti).

Figure 1C:
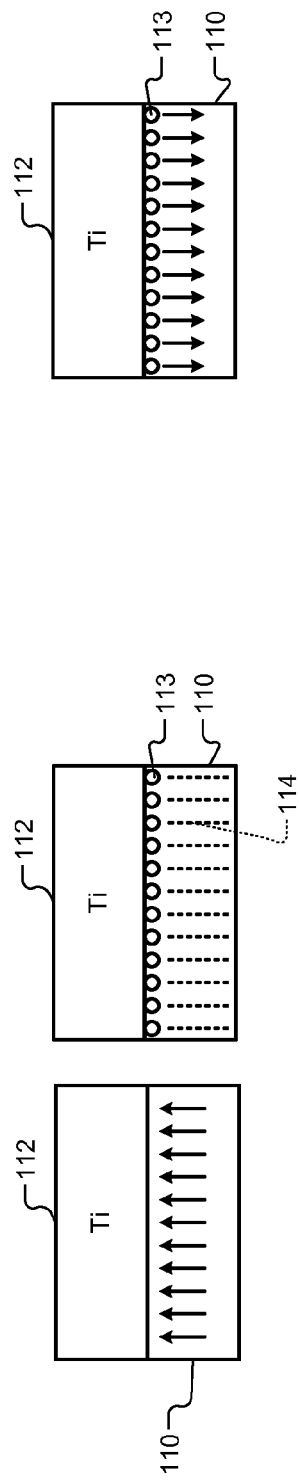
FIG. 1C shows creation of multiple conducting paths in a transitional metal oxide layer due to movement of oxygen ions from the transitional metal oxide layer to a reactive metal layer of the resistive element shown in FIG. 1B.

FIG. 1C shows flow of oxygen ions 113 from the dielectric layer 110 to the reactive metal layer 112 when a positive voltage is applied to the top electrode 106 relative to the bottom electrode 108. The flow of oxygen ions 113 from the dielectric layer 110 to the reactive metal layer 112 creates a plurality of conducting paths 114. Consequently, the resistive element 104 has a low resistance, and the RRAM cell 100 has a low resistance state.

Figure 1D:
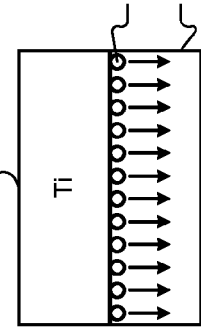
FIG. 1D shows resetting of the multiple conducting paths in the transitional metal oxide layer due to return of the oxygen ions from the reactive metal layer to the transitional metal oxide layer of the resistive element shown in FIG. 1B.

FIG. 1D shows flow of oxygen ions 113 from the reactive metal layer 112 to the dielectric layer 110 when a negative voltage (or a less positive voltage than that applied in FIG. 1C) is applied to the top electrode 106 relative to the bottom electrode 108. The oxygen ions 113 return to the dielectric layer 110 through the plurality of conducting paths 114. Consequently, the resistive element 104 has a high resistance, and the RRAM cell 110 has a high resistance state.

Figure 2:
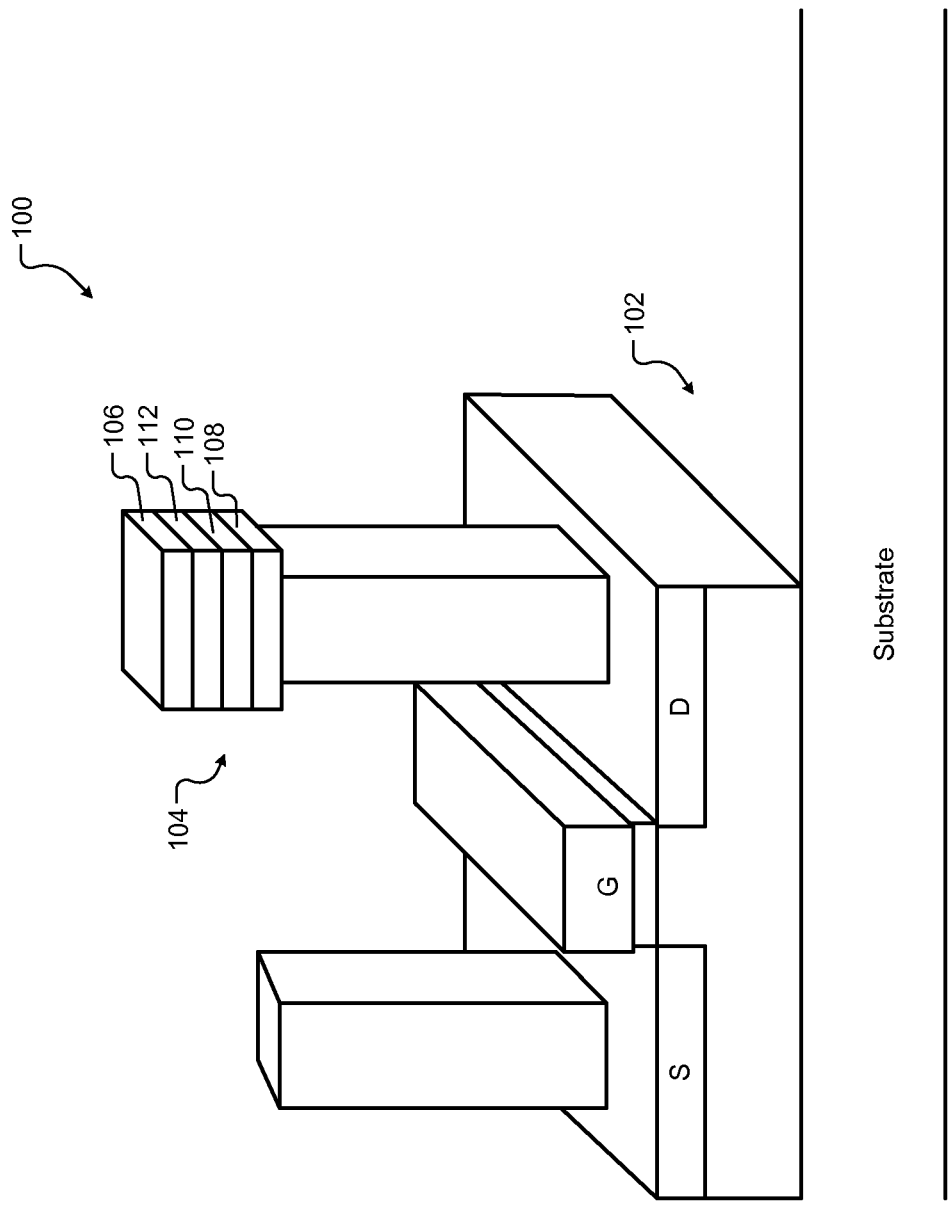
FIG. 2 shows an example of a RRAM cell, where all the layers of the resistive element are flat.

FIG. 2 shows an example of the RRAM cell 100. For example, the access device 102 is shown as a metal-oxide semiconductor field-effect transistor (MOSFET) having a source terminal, a drain terminal, and a gate terminal. Throughout the present disclosure, while certain aspects are described with specific references to the drain and source terminals, the source and drain terminals are interchangeable. The source terminal is connected to a bit line via a contact. The gate terminal is connected to a word line via a contact. The drain terminal is connected to the bottom electrode 108 of the resistive element 104 via a contact.

Each of the bottom electrode 108, the dielectric layer 110, the reactive metal layer 112, and the top electrode 106 is a flat layer of respective material. The flatness of these layers causes the formation of the plurality of conducting paths shown in FIG. 1C. The plurality of conducting paths makes programming of the RRAM cell 100 difficult. Particularly, when programming the RRAM cell 100 from the low resistance state to the high resistance state, a sufficiently high voltage must be applied to ensure that each of the plurality of conducting paths is reset.

The present disclosure relates to creating a novel contact between the drain contact of the access device and the bottom electrode of the resistive element. The novel contact is a sharp, pointed structure. The present disclosure further relates to a novel resistive element structure. Specifically, the resistive element is created by arranging layers of the bottom electrode, the dielectric layer, the reactive metal layer, and the top electrode of the resistive element around the sharp contact. Additionally, the thickness of the dielectric layer at the tip of the sharp contact is made less than the thickness of the remainder of the dielectric layer. This structure allows formation of a single conducting path in the dielectric layer, which is easy to program with a voltage lower than the voltage normally used to program the RRAM cell.

Compared to the traditional flat contact, this novel structure strengthens the field and current densities at the center of the resistive element. The localized programming enables the new RRAM cell with better writability and device matching compared to the traditional RRAM cell. The new approach does not add a mask layer to the manufacturing process.

Figure 3:
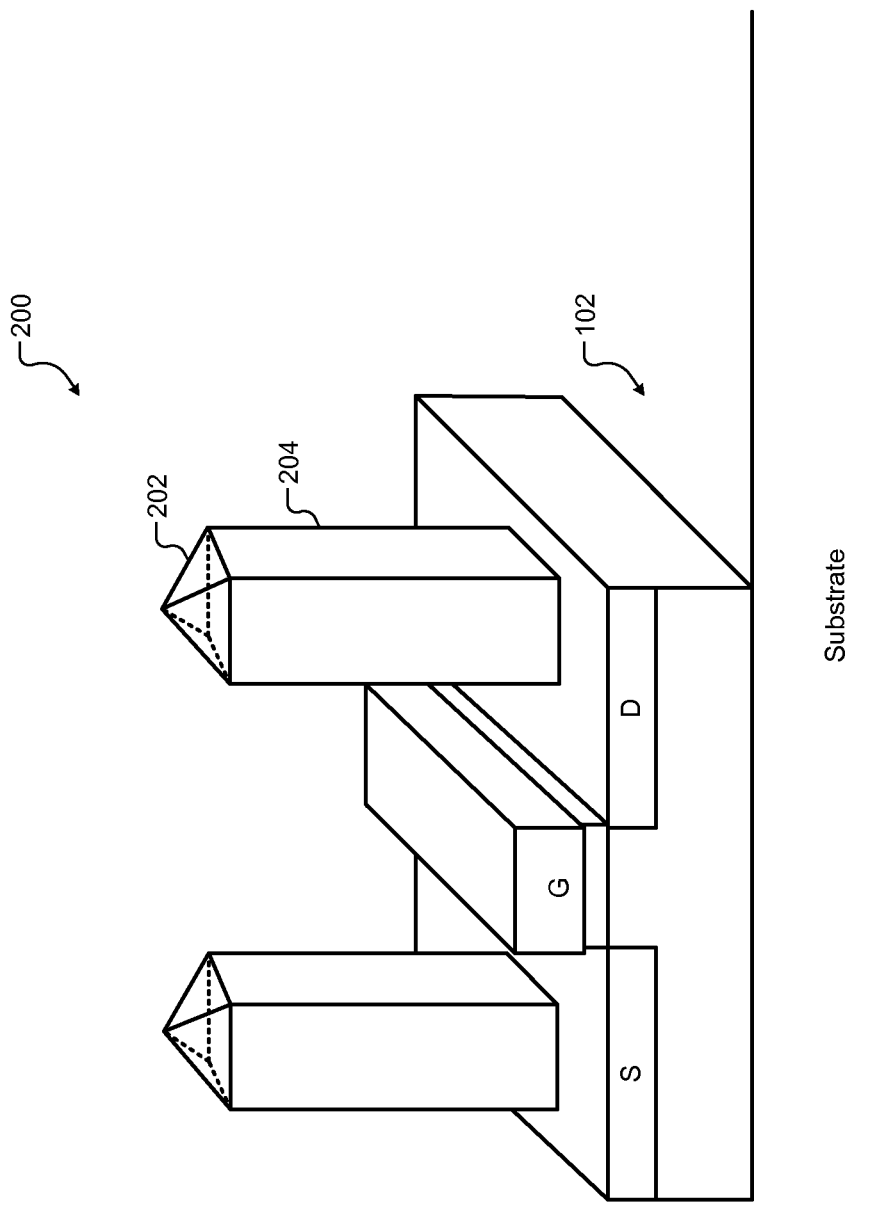
FIG. 3 shows an example of a sharp contact grown on the surface of a drain contact of an access device of a RRAM cell.

FIG. 3 shows an example of a RRAM cell 200 according to the present disclosure. The RRAM cell 200 includes the access device 102. A sharp contact 202 is created between a drain contact 204 of the access device 102 and the bottom electrode of the resistive element (not shown). The sharp contact 202 can be realized by employing nanotechnologies such as quantum dots growth on the surface of the drain contact 204 of the access device 102. Using these methods, a lightning-rod-like sharpened structure is grown with precision on the surface of the drain contact (e.g., tungsten) 204 to form the sharp contact 202.

Figure 4:
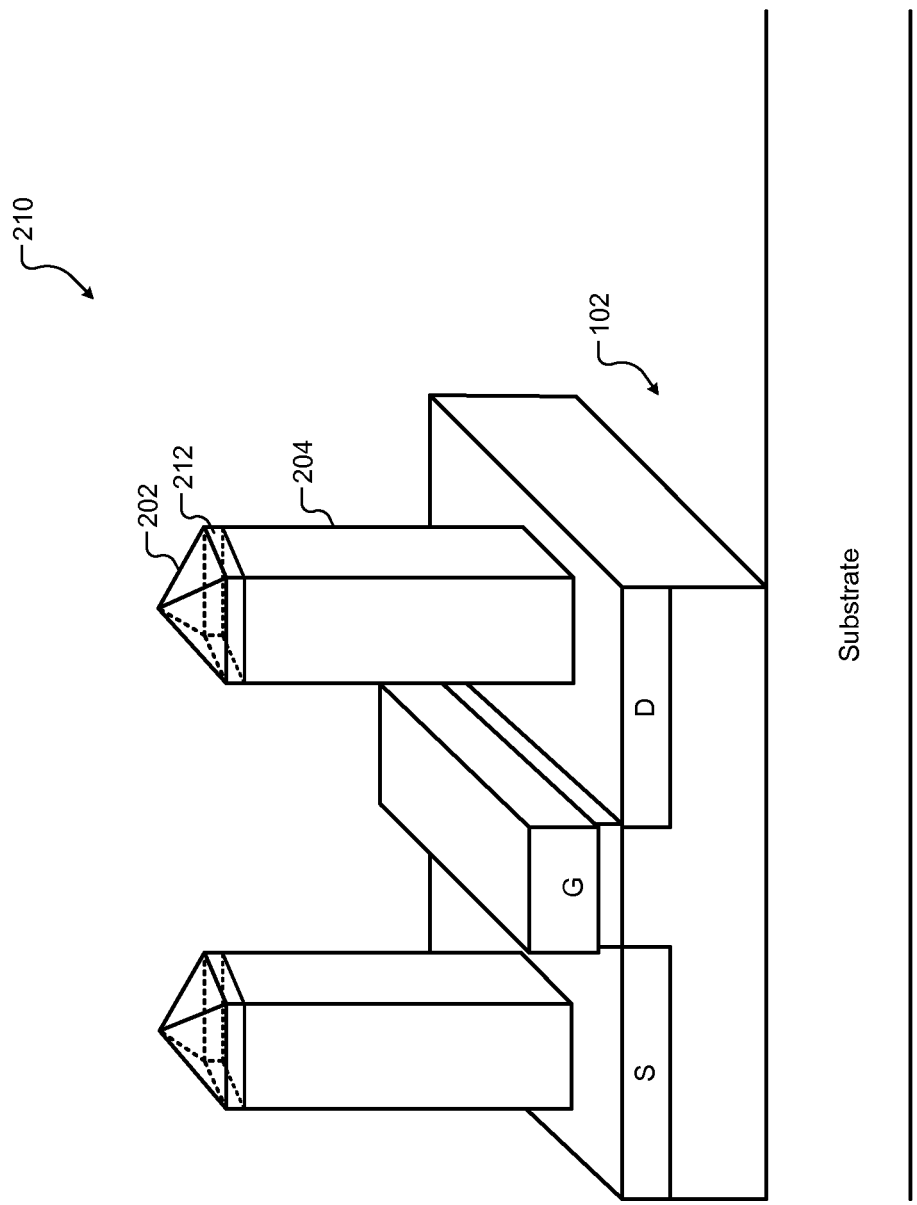
FIG. 4 shows an example of a sharp contact grown on an interface metal layer pre-grown on the surface of a drain contact of an access device of a RRAM cell.

FIG. 4 shows an example of an alternate embodiment of a RRAM cell 210 according to the present disclosure. Instead of growing the sharp contact 202 directly on the surface of the drain contact (e.g., tungsten) 204 of the access device 102, initially, a suitable interface metal material 212 may be selectively grown on the surface of the drain contact 204. Subsequently, the sharp contact 202 is grown on the interface metal material 212.

FIG. 5 shows an example of another alternative embodiment of a RRAM cell 220 according to the present disclosure. Optionally, for better contact resistance, the sharp contact 202 may be etched back to expose part of the original surface of the drain contact (e.g., tungsten) 204 of the access device 102. The result is a smaller sharp contact 202-1 in a middle portion of the surface of the drain contact 204 of the access device 102.

Figure 6A:
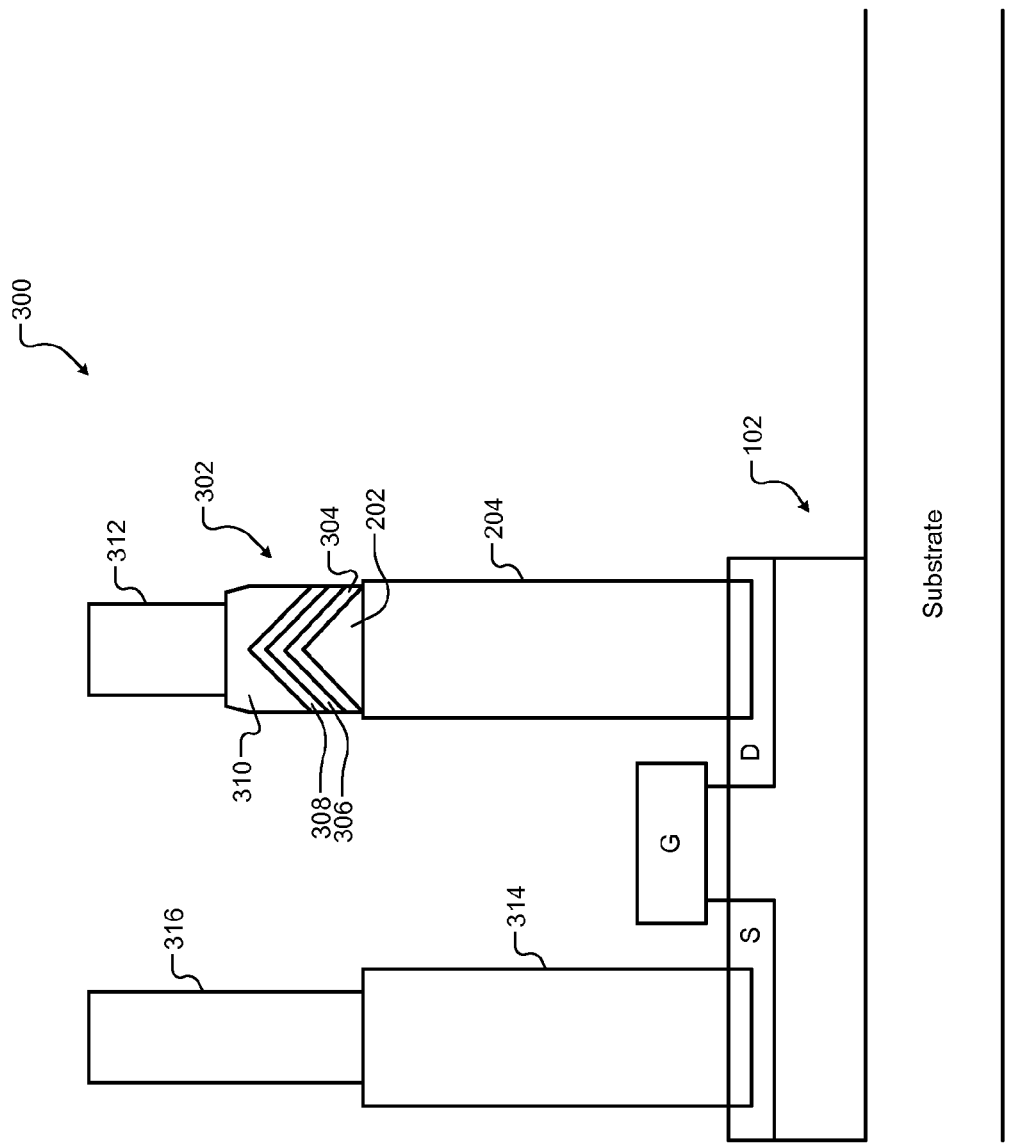
FIG. 6A shows an example of a RRAM cell with the sharp contact and a resistive element created by growing layers of the resistive element around the sharp contact.

FIG. 6A shows a cross-section of an example of a RRAM cell 300 according to the present disclosure. The RRAM cell 300 includes the access device 102 and a new resistive element 302 according to the present disclosure. The sharp contact 202 (or 202-1 shown in FIG. 5) is grown on the surface of the drain contact (e.g., tungsten) 204 of the access device 102 (or on the interface metal material 212 shown in FIG. 4) as explained before.

The resistive element 302 includes a bottom electrode 304, a dielectric layer 306, a reactive metal layer 308, and a top electrode 310 grown around the sharp contact 202 as shown. For example, the dielectric layer 306 includes a layer of a transitional metal oxide (e.g., $HfO_2$). The dielectric layer 306 acts as a donor of oxygen ions. For example, the reactive metal layer 308 includes a layer of titanium (Ti).

Figure 6D:
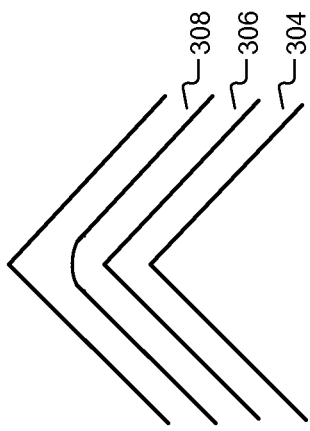
FIGS. 6B-6D illustrate a process of thinning the transitional metal oxide layer of the resistive element shown in FIG. 6A at the tip of the transitional metal oxide layer by bombarding the tip during reactive metal layer formation.
Figure 6C:
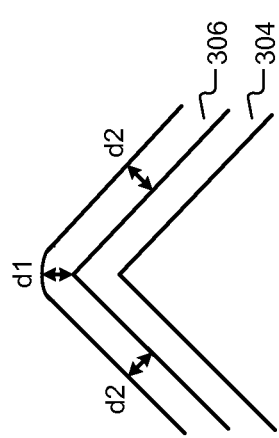
Figure 6B:
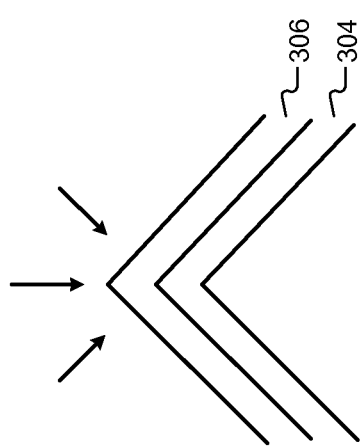

As shown in FIGS. 6B and 6D, during the formation of the reactive metal layer 308, a process such as physical vapor deposition (PVD) may be tuned to be initially more bombarding. For example, the tip of the transitional metal oxide layer (i.e., the dielectric layer 306) may be bombarded with an inert gas (e.g., Ar). Due to the bombarding, the transitional metal oxide layer (i.e., the dielectric layer 306) may become slightly thinner at the tip than at the slopes. In FIG. 6C, the distance d1 between the tip of the dielectric layer 306 and the tip of the bottom electrode 304 is less than the distance d2 between the dielectric layer 306 and the bottom electrode 304 elsewhere. The thinness of the dielectric layer 306 at the tip will ensure that programming of the RRAM cell 300 is more likely to occur (i.e., to be localized) at the tip via a single conducting path. Optionally, after bottom electrode, transition metal oxide, reactive metal, and top electrode deposition, planarization may be utilized to create a smoother surface for later patterning steps.

The top electrode 310 of the resistive element 302 is connected to a contact 312. The contact 312 provides a connection to other circuitry (e.g., a voltage generator used to program the RRAM cell 300). The source terminal of the access device 102 is connected to a source contact 314. The source contact 314 is connected to a bit line via a contact 316.

FIG. 7 shows another embodiment of a RRAM 350 according to the present disclosure. When the sharp contact 202 is grown on the surface of the drain contact 204, a sharp contact 352 is also grown on the source contact 314. The sharp contact 352 may be of the same dimensions as the sharp contact 202 or may be smaller than the sharp contact 202. The sharp contact 352 may be etched away if the resistivity of the sharp contact 352 is high or can be left on top of the source contact 314 if the resistivity of the sharp contact 352 is low.

In general, the sharp contacts 202, 202-1, and 352 can have the shape of a pyramid or a cone, where the base of the pyramid or the cone connects to the drain contact 204 (and the source contact 314), and an apex of the pyramid or a vertex of the cone connects to the bottom electrode of the resistive element. A pyramid is a polyhedron formed by connecting a polygonal base to a point called an apex of the pyramid. For example, depending on the shape of the drain contact 204 (and the source contact 314), the pyramid can be a square pyramid, a pentagonal pyramid, a hexagonal pyramid, or a tetrahedron. Alternatively, for example, if the shape of the drain contact 204 (and the source contact 314) is round or oval, the shape of the sharp contacts 202, 202-1, and 352 may be conical. In some implementations, regardless of the shape of the drain contact 204 (and the source contact 314), the sharp contacts 202, 202-1, and 352 can have a shape that has a greater surface area at the point of contact with the drain contact 204 (and the source contact 314) than at the point of contact with the bottom electrode of the resistive element. Typically, the shape of the sharp contacts 202, 202-1, and 352 converges to a point having infinitesimal dimensions at the point of contact with the bottom electrode of the resistive element.

Figure 8:
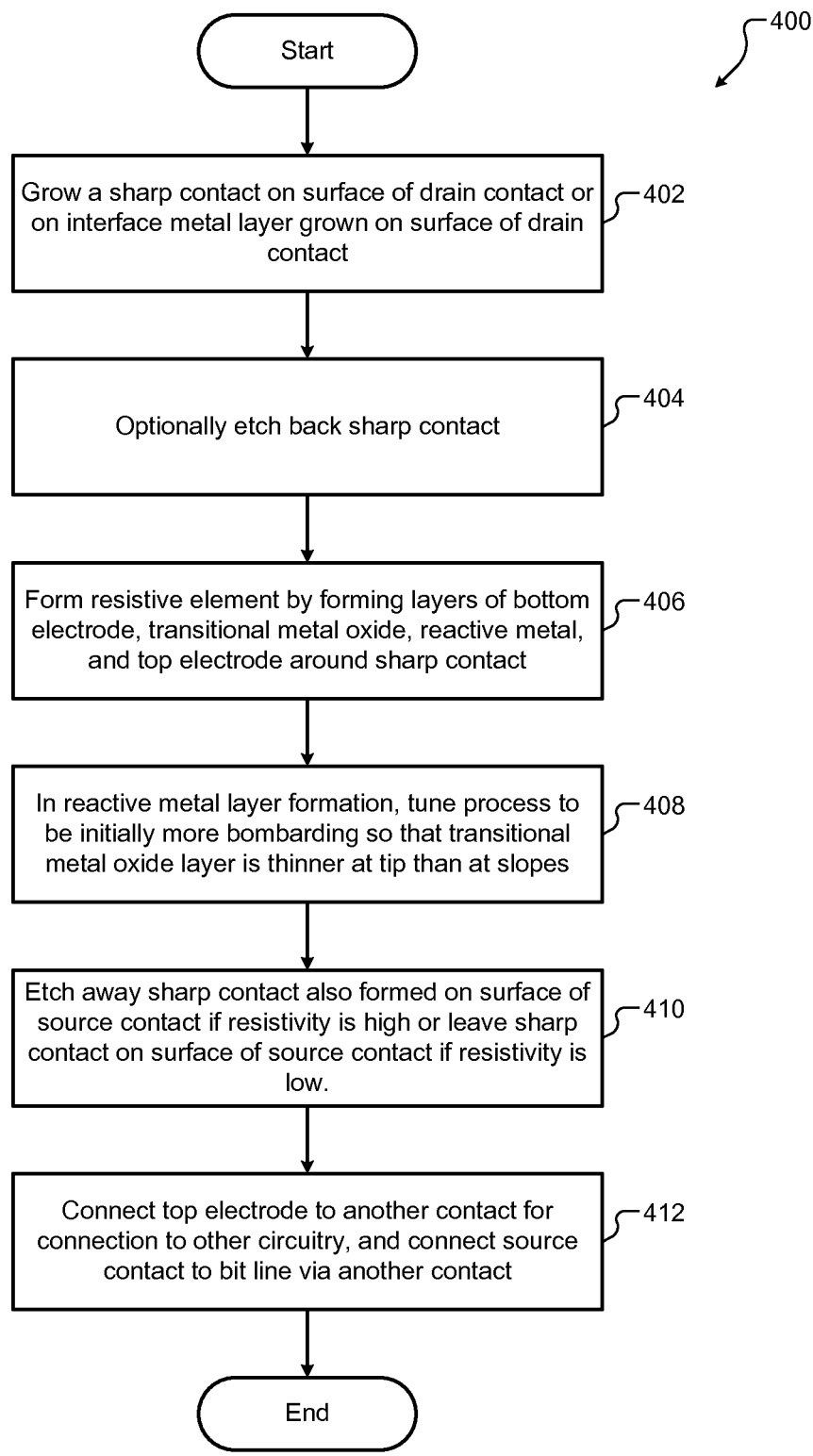
FIG. 8 is a flowchart of a method for creating the sharp contact(s) and the resistive element shown in FIGS. 3-7.

FIG. 8 shows a method 400 for creating a sharp contact between a drain contact of an access device and a bottom electrode of a resistive element and for creating a resistive element according to the present disclosure. At 402, a sharp contact is grown on a surface of a drain contact or on a surface of an interface metal layer pre-grown on the surface of the drain contact. At 404, the sharp contact is optionally etched back. At 406, a resistive element is created on top of the sharp contact by growing layers of a bottom electrode, a transitional metal oxide, a reactive metal, and a top electrode around the sharp contact. At 408, during reactive metal layer formation, the process is tuned to be initially more bombarding so that the transitional metal oxide layer is thinner at the tip than at the slopes. At 410, a sharp contact also formed on the surface of the source contact can be etched away if the resistivity of the sharp contact is high or can be preserved if the resistivity of the sharp contact is low. At 412, the top electrode of the resistive element is connected to another contact for connection to other circuitry, and the source contact (with or without the associated sharp contact) is connected to a bit line via another contact.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A cell of a resistive random access memory, the cell comprising:
   a resistive element including (i) a first electrode, and (ii) a second electrode; and a switch including (i) a first terminal connected to a first contact, and (i) a second terminal connected to a second contact, wherein the second contact is connected to the second electrode of the resistive element via a third contact, wherein the third contact has a shape including a first surface and a second surface that is opposite to the first surface, and wherein the shape of the third contact tapers inward from the first surface towards the second surface.

2. The cell of claim 1, wherein the third contact substantially has a shape of a pyramid or a cone.

3. The cell of claim 2, further comprising an interface metal layer between the second contact and the first surface of the third contact.

4. The cell of claim 1, wherein the third contact is partially etched to reduce a volume of the third contact.

5. The cell of claim 1, wherein the resistive element comprises:
   a first layer of transitional metal oxide arranged adjacent to the second electrode, and
   a second layer of a reactive metal arranged adjacent to (i) the first layer of transitional metal oxide, and (i) the first electrode.

6. The cell of claim 5, wherein the first layer of transitional metal oxide is thinner near a center of the first layer relative to a remainder of the first layer.

7. The cell of claim 5, wherein the first electrode of the resistive element is connected to a fourth contact, and wherein the first contact connected to the first terminal of the switch is connected to a bit line via a fifth contact.

8. The cell of claim 7, wherein:
   a sixth contact is arranged between (i) the first contact connected to the first terminal of the switch, and (ii) the fifth contact; and
   the sixth contact has a structure of the third contact.

9. The cell of claim 1, wherein the resistive element is configured to have (i) a first resistance in response to applying a first voltage across the first electrode and the second electrode, and (ii) a second resistance in response to applying a second voltage across the first electrode and the second electrode.

10. The cell of claim 1, wherein the switch further includes a control terminal connected to a word line.

11. A method for connecting elements of a cell of a resistive random access memory, wherein the elements of the cell include (i) an switch and (ii) a resistive element, wherein the switch includes (i) a first terminal and (ii) a second terminal, and wherein the resistive element includes (i) a first electrode and (ii) a second electrode, the method comprising:

connecting (i) the first terminal and (ii) the second terminal of the switch respectively to (i) a first contact and (ii) a second contact; and connecting the second contact of the switch to the second electrode of the resistive element via a third contact, wherein the third contact has a shape including a first surface and a second surface that is opposite to the first surface, and wherein the shape of the third contact tapers inward from the first surface towards the second surface.

12. The method of claim 11, wherein the third contact substantially has a shape of a pyramid or a cone.

13. The method of claim 12, further comprising arranging an interface metal layer between the second contact and the first surface of the third contact.

14. The method of claim 11, further comprising partially etching the third contact to reduce a volume of the third contact.

15. The method of claim 11, further comprising forming the resistive element by:
   arranging a first layer of transitional metal oxide adjacent to the second electrode; and
   arranging a second layer of a reactive metal adjacent to (i) the first layer of transitional metal oxide, and (i) the first electrode.

16. The method of claim 15, wherein the first layer of transitional metal oxide is thinner near a center of the first layer relative to a remainder of the first layer.

17. The method of claim 15, further comprising:
   connecting the first electrode of the resistive element to a fourth contact; and
   connecting the first contacted to the first terminal of the switch to a bit line via fifth contact.

18. The method of claim 17, further comprising:
   arranging a sixth contact between (i) the first contact connected to the first terminal of the switch, and (ii) the fifth contact,
   wherein the sixth contact has a structure of the third contact.

19. The method of claim 11, further comprising:
   applying a first voltage across the first electrode and the second electrode to program the cell to a first resistance state; and
   applying a second voltage across the first electrode and the second electrode to program the cell to a second resistance state.

20. The method of claim 11, further comprising:
   connecting a control terminal of the switch to a word line; and
   selecting and deselecting the cell using the word line.

* * * * *